(12) United States Patent
Yoshihisa

(10) Patent No.: US 6,440,787 B1
(45) Date of Patent: Aug. 27, 2002

(54) MANUFACTURING METHOD OF SEMICONDUCTOR DEVICE

(75) Inventor: Yasuki Yoshihisa, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 38 days.

(21) Appl. No.: 09/598,465

(22) Filed: Jun. 22, 2000

(30) Foreign Application Priority Data

Jan. 20, 2000 (JP) .................................... 2000-011708

(51) Int. Cl.⁷ ............................................. H01L 21/8238
(52) U.S. Cl. ........................ 438/202; 438/203; 438/234
(58) Field of Search ................................. 438/202, 203, 438/204, 205, 234, 365

(56) References Cited

U.S. PATENT DOCUMENTS 5,132,234 A * 7/1992 Kim et al.
5,192,992 A * 3/1993 Kim et al.
5,354,699 A * 10/1994 Ikeda et al.

* cited by examiner

Primary Examiner—Tuan H. Nguyen
(74) Attorney, Agent, or Firm—McDermott, Will & Emery

(57) ABSTRACT

A manufacturing method of a semiconductor device which can form high-performance bipolar transistors and high-performance MOS transistors on the same substrate while minimizing increases in the number of manufacturing steps and the number of masks. A base lead-out electrode 105a of an NPN bipolar transistor and the gate 105b of a PMOS transistor can be formed at the same time by using the same material (a polysilicon film 105), and an emitter lead-out electrode 122a of the NPN bipolar transistor and the gate 122b of an NMOS transistor are formed at the same time by using the same material (a polysilicon film 122). Therefore, a surface channel PMOS transistor can be obtained while an increase in the number of manufacturing steps is prevented. As a result, the leak current of the PMOS transistor can be reduced and the threshold voltage Vth can be controlled easily.

14 Claims, 17 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device. In particular, the present invention relates to a manufacturing method of a semiconductor device having a self-aligned high-performance bipolar transistor and a dual gate high-performance CMOS transistor on the same substrate.

2. Description of Related Art

A conventional BiCMOS semiconductor device having a bipolar transistor and a CMOS transistor on the same substrate has an advantage that high operation speed and high load driving ability of the bipolar transistor and a high integration density and lower power consumption of the MOS transistors can be realized simultaneously. However, to form a high-performance bipolar transistor and high-performance MOS transistors on the same substrate, there are problems that the number of manufacturing steps and the number of masks increase.

FIGS. 15A–15D to FIGS. 18A–18C show a process of a conventional manufacturing method of a BiCMOS semiconductor device having a self-aligned high-performance bipolar transistor and a CMOS transistor on the same substrate.

As shown in FIG. 15A, field oxide films 101 are formed by a LOCOS method or the like on a semiconductor substrate 100 having buried layers and well layers 102a and 102b are formed. Then, as shown in FIG. 15B, an insulating film 153 to become gate oxide films of MOS transistors is formed. As shown in FIG. 15C, a doped polysilicon film 156 to become the gates of the MOS transistors is deposited on the insulating film 153 and an insulating film 157 of TEOS or the like is deposited on the doped polysilicon film 156. Then, the gates of the MOS transistors are formed by using a resist pattern 158. As shown in FIG. 15D, LDD layers 159 and 160 of the MOS transistors are formed. Then, frames 161 are formed on the side faces of the gates of the MOS transistors by depositing an insulating film of TEOS or the like and dry-etching it. Then, source/drain layers 162 and 163 of the MOS transistors are formed by injection.

As shown in FIG. 16A, the MOS transistor forming region is protected by depositing an insulating film 164 of TEOS or the like. As shown in FIG. 16B, a polysilicon film 165 is deposited and an impurity $BF_2$ 106 (170) is implanted into the polysilicon film 165 over its entire area. Subsequently, as shown in FIG. 16C, an insulating film 166 of TEOS or the like is deposited on the entire surface.

As shown in FIG. 17A, after performing photolithography, a base lead-out electrode is formed by etching the polysilicon film 165 and the insulating film 166. Then, after an oxide film 109 is formed by oxidation, an external base layer 110 is formed by diffusing the impurity in the polysilicon film 165 into the semiconductor film 100. As shown in FIG. 17B, an intrinsic base layer 110a is formed by implanting an impurity $BF_2$. Then, a frame is formed on the side face of the base lead-out electrode by depositing an insulating film 167 of TEOS or the like and etching it as shown in FIG. 17C. As shown in FIG. 17D, a polysilicon film 169 to become an emitter lead-out electrode of an NPN transistor is deposited and an impurity 168 of As or the like is implanted over the entire area.

As shown in FIG. 18A, after a desired region is defined by photolithography, an emitter lead-out electrode 172 of the NPN transistor is formed by dry etching. As shown in FIG. 18B, an interlayer insulating film 171 such as a TEOS/BPSG/TEOS film is deposited and its surface is planarized by subjecting it to reflow. Further, an emitter layer 173 is formed by diffusing the impurity into the semiconductor substrate 100 from the emitter lead-out electrode 172. Finally, interconnections 174 etc. are formed as shown in FIG. 18C.

As described above, the MOS region is protected by depositing the insulating film 164, whereby damage that would otherwise occur in later forming the NPN transistor is prevented and thereby the characteristics of the MOS transistors are prevented from being deteriorated.

The above-described conventional BiCMOS semiconductor device having the bipolar transistor and the CMOS transistor on the same substrate has a problem that the measure to prevent deterioration in transistor characteristics makes the process complex and increases the number of manufacturing steps. To decrease the number of manufacturing steps even by a small number, the gate electrodes of both of the NMOS transistor and the PMOS transistor are given N-type conductivity and the PMOS transistor is made a buried channel type. This results in problems that the leak current of the PMOS transistor increases and the threshold voltage Vth is difficult to control.

SUMMARY OF THE INVENTION

The present invention has been made to solve the above problems in the art, and an object of the invention is therefore to provide a manufacturing method of a semiconductor device and which can form high-performance bipolar transistors and high-performance MOS transistors on the same substrate while minimizing increases in the number of manufacturing steps and the number of masks.

According to an aspect of the present invention, there is provided a manufacturing method of a semiconductor device which forms bipolar transistors and MOS transistors on the same semiconductor substrate, comprising the steps of a first insulating film forming of forming separated first insulating films on a major surface of the semiconductor substrate; a second insulating film forming of forming a second insulating film on the semiconductor substrate and the first insulating films; a second insulating film removing of removing a portion, on the semiconductor substrate, of the second insulating film in a region where to form a base of a first conductivity type bipolar transistor; forming a first polysilicon film on a second-insulating-film-removed portion of the semiconductor substrate and a remaining portion of the second insulating film, implanting a first conductivity type impurity of a first concentration into the first polysilicon film, and forming a third insulating film on the first polysilicon film; a first forming of forming, at the same time, an external base lead-out electrode and a gate of a first conductivity type MOS transistor on the semiconductor substrate by etching a stacked film of the first polysilicon film and the third insulating film in predetermined regions; forming a fourth insulating film in the etched, predetermined regions of the stacked film, and, at the same time, forming an external base layer by introducing the first conductivity type impurity of a first concentration into the semiconductor substrate from the external base lead-out electrode of the first conductivity type bipolar transistor; defining, by photolithography, a region where to form an external base lead-out electrode of the first conductivity type bipolar transistor, and forming the link base layer of the first conductivity type bipolar transistor by implanting the first conductivity impurity of a second concentration into the semiconductor substrate in the defined region; a second forming of defining, by photolithography, a first conductivity type MOS transistor forming region where to form the first conductivity type MOS transistor and a second conductivity type bipolar transistor forming region where to form an emitter and a collector of a second conductivity type bipolar transistor, and forming LDD layers in the first conductivity type MOS transistor forming region and an emitter layer and a collector layer in the second conductivity type bipolar transistor forming region by implanting the first conductivity type impurity of a third concentration into the semiconductor substrate in the first conductivity type MOS transistor forming region and the second conductivity type bipolar transistor forming region; forming a fifth insulating film on the films existing after execution of the step of second forming; a frame forming of forming frames on a side face of the external base lead-out electrode of the first conductivity type bipolar transistor and a side face of the gate of the first conductivity type MOS transistor by etching the fifth insulating film; a third forming of defining, by photolithography, a second conductivity type bipolar transistor intrinsic base forming region where to form an intrinsic base of the second conductivity type bipolar transistor and a first conductivity type MOS transistor forming region where to form the first conductivity type MOS transistor, and implanting the first conductivity type impurity of a fourth concentration into the semiconductor substrate in the second conductivity type bipolar transistor intrinsic base forming region and the first conductivity type MOS transistor forming region, to form the emitter layer and the collector layer in the second conductivity type bipolar transistor intrinsic base forming region and to form a source and a drain in the first conductivity type MOS transistor forming region; a sixth insulating film forming of forming a sixth insulating film on predetermined films existing after execution of the step of third forming; defining, by photolithography, a region where to form an external base lead-out electrode of the first conductivity type bipolar transistor, and forming the intrinsic base layer of the first conductivity type bipolar transistor by implanting the first conductivity type impurity of a fifth concentration into the semiconductor substrate in the defined region; a semiconductor substrate exposing of etching the sixth insulating film in the region where to form the external base lead-out electrode of the first conductivity type bipolar transistor, to expose the major surface of the semiconductor substrate there; forming a second polysilicon film on the films existing after execution of the step of semiconductor substrate exposing, implanting a second conductivity type impurity of a first concentration into the second polysilicon film, and forming a seventh insulating film on the second polysilicon film; a fourth forming of forming an emitter lead-out electrode of the first conductivity type bipolar transistor and a gate of a second conductivity type MOS transistor at the same time by etching a stacked film of the seventh insulating film and the second polysilicon film in predetermined regions; a second conductivity type MOS transistor LDD layer forming of defining, by photolithography, a region where to form the second conductivity type MOS transistor, and forming LDD layers of the second conductivity type MOS transistor by implanting the second conductivity type impurity of a second concentration into the semiconductor substrate in the defined region; forming an eighth insulating film on the films existing after execution of the step of second conductivity type MOS transistor LDD layer forming, and forming a frame on a side face of the gate of the second conductivity type MOS transistor by etching the eighth insulating film; a second conductivity type MOS transistor source and drain layers forming of defining, by photolithography, a region where to form the second conductivity type MOS transistor, and forming a source layer and a drain layer of the second conductivity type MOS transistor by implanting the second conductivity type impurity of a third concentration in the semiconductor substrate in the defined region; and forming an interlayer insulating film on the films existing after execution of the step of second conductivity type MOS transistor source and drain layers forming, and forming an emitter layer by diffusing the first conductivity type impurity into the semiconductor substrate from the emitter lead-out electrode of the first conductivity type bipolar transistor.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1A:
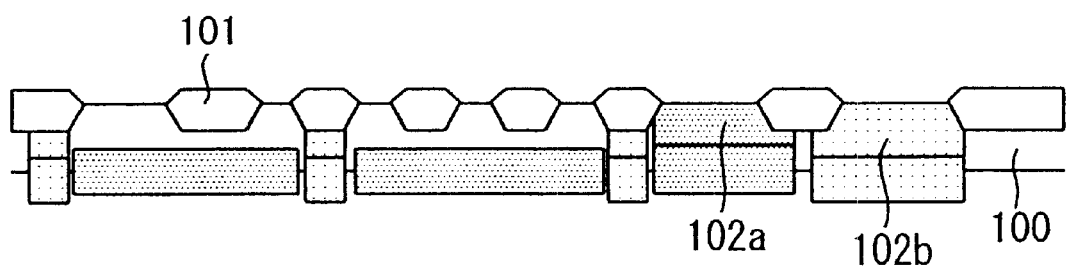
FIGS. 1A–1D show a process of a manufacturing method according to embodiments 1 or 3 of a BiCMOS semiconductor device having self-aligned high-performance bipolar transistors and a CMOS transistor on the same substrate.

Embodiments of the present invention will be described below with reference to the accompanying drawings. It is noted that the same reference symbols in the drawings denote the same or corresponding components.

Embodiment 1

FIGS. 1A–1D to FIG. 7A–7C show a process of a manufacturing method according to a embodiment 1 of a BiCMOS semiconductor device having self-aligned high-performance bipolar transistors and a CMOS transistor on the same substrate.

Figure 1B:
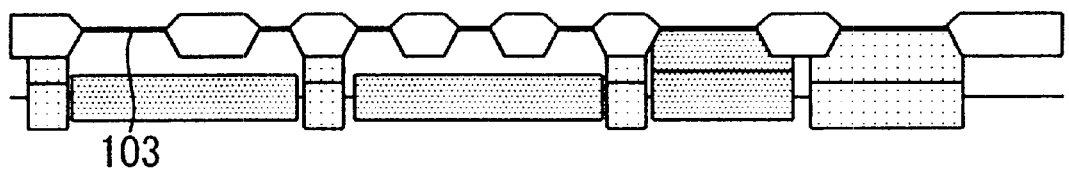
Figure 1C:
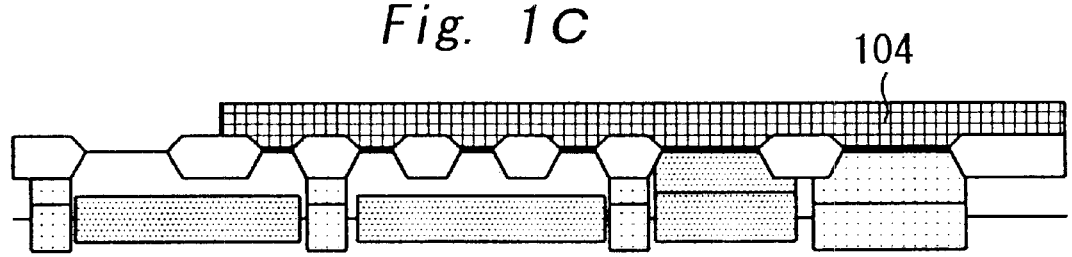
Figure 1D:
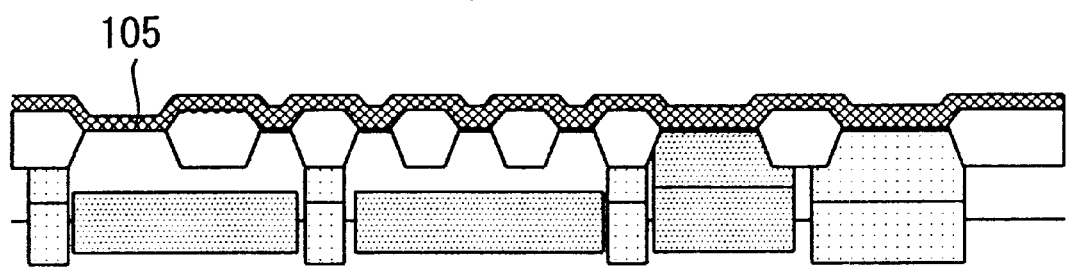

As shown in FIG. 1A, field oxide films (first insulating films) 101 are formed separately by a LOCOS method or the like on a semiconductor substrate 100 having buried layers and well layers 102a and 102b are formed. Then, as shown in FIG. 1B, an insulating film (second insulating film) 103 to become a gate oxide film of a PMOS transistor (first conductivity type MOS transistor) is formed on the semiconductor substrate 100 and the field oxide films 101 (second insulating film forming step). As shown in FIG. 1C, a region where to form the base of an NPN bipolar transistor (first conductivity type bipolar transistor) is formed as an opening of a resist pattern 104 and the insulating film 103 is removed there (second insulating film removing step). As shown in FIG. 1D, a polysilicon film (first polysilicon film) 105 to become a base lead-out electrode of the NPN bipolar transistor and the gate of the PMOS transistor is deposited.

Figure 2A:
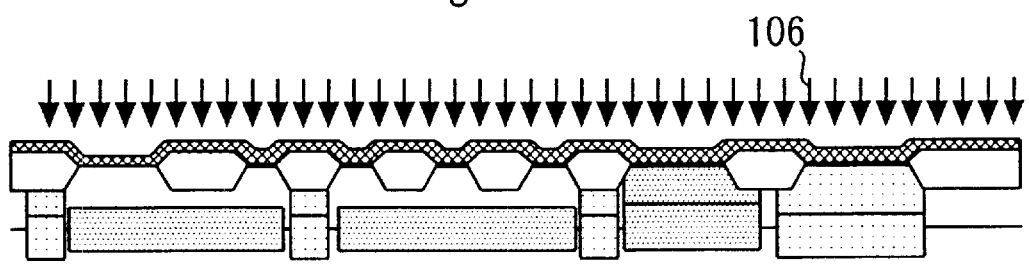
FIGS. 2A–2D show a process of a manufacturing method according to embodiments 1 or 3 of a BiCMOS semiconductor device having self-aligned high-performance bipolar transistors and a CMOS transistor on the same substrate.
Figure 2B:
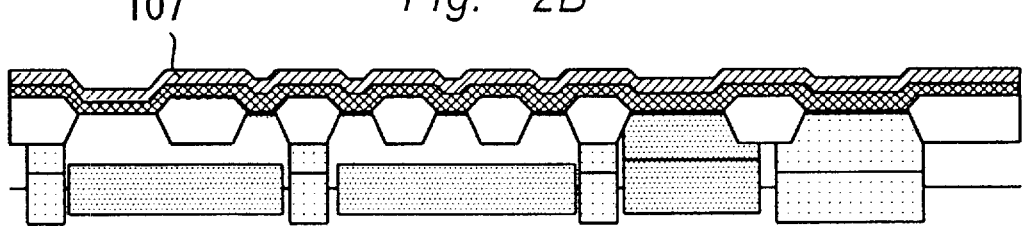
Figure 2C:
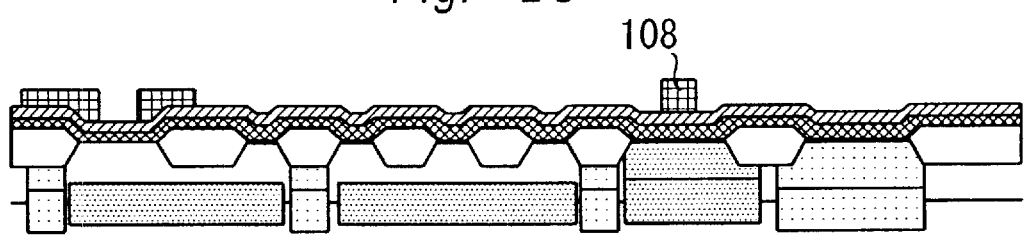
Figure 2D:
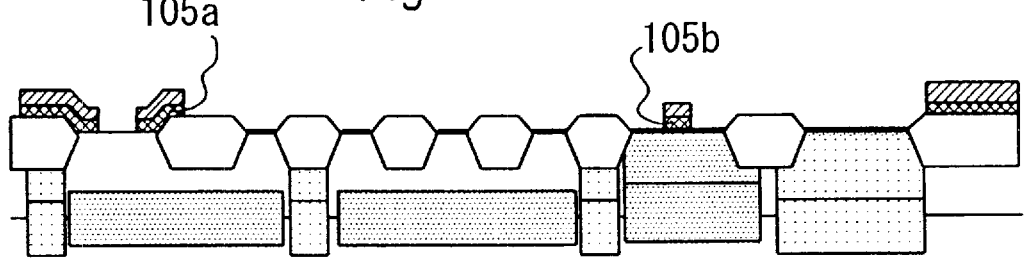

As shown in FIG. 2A, an impurity (first conductivity type impurity of a first concentration) 106 of B or the like is implanted into the polysilicon film 105 over the entire area. As shown in FIG. 2B, an insulating film (third insulating film) of TEOS or the like is deposited. As shown in FIG. 2C, prescribed regions of the stacked film of the polysilicon film 105 and the insulating film 107 are defined by a resist pattern 108. As shown in FIG. 2D, an external base lead-out electrode 105a of the NPN bipolar transistor and a gate 105b of the PMOS transistor are formed at the same time by dry etching or the like (first forming step).

Figure 3A:
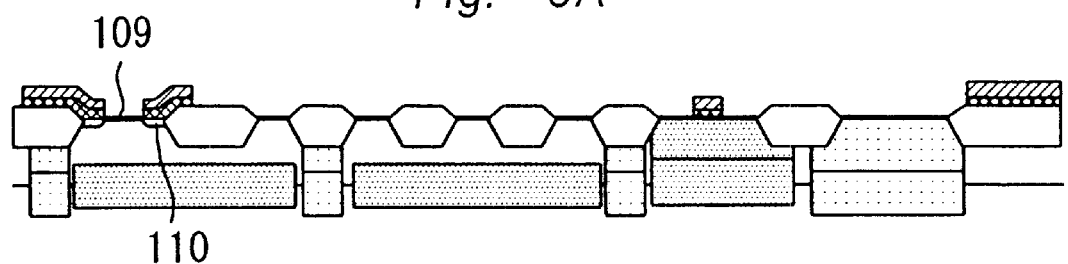
FIGS. 3A–3C show a process of a manufacturing method according to embodiments 1 or 3 of a BiCMOS semiconductor device having self-aligned high-performance bipolar transistors and a CMOS transistor on the same substrate.
Figure 3B:
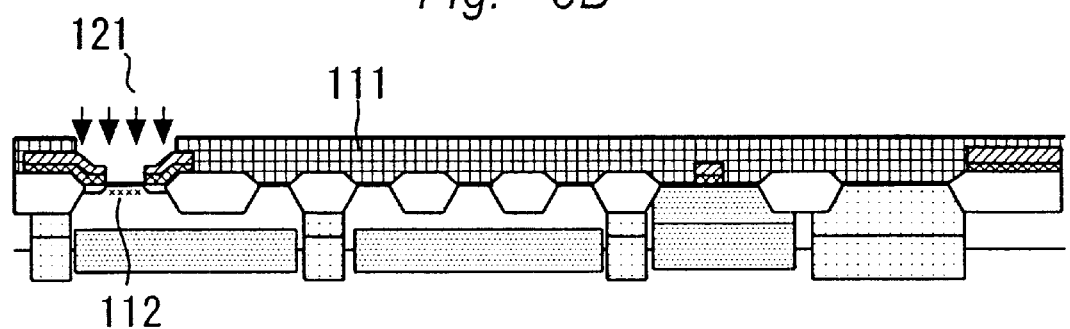
Figure 3C:
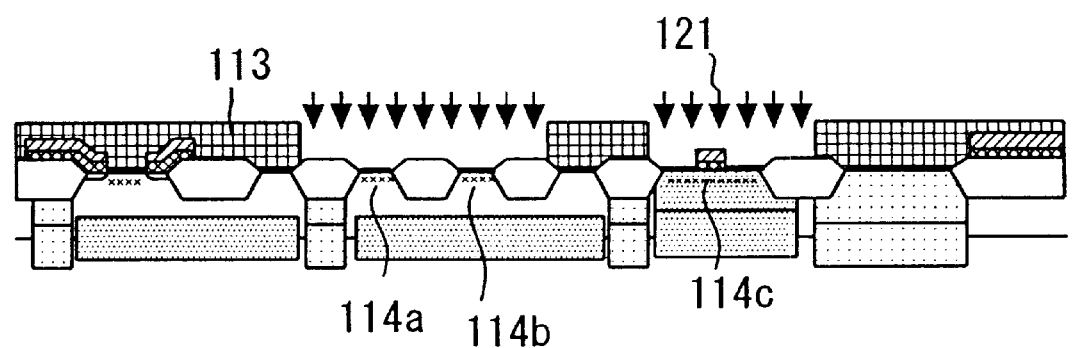

As shown in FIG. 3A, an oxide film (fourth insulating film) 109 is formed by oxidation and an external base layer 110 is formed by introducing the impurity 106 into the semiconductor substrate 100 from the external base lead-out electrode 105a of the NPN bipolar transistor. As shown in FIG. 3B, after a region where to form the external base lead-out electrode 105a of the NPN bipolar transistor is defined by a resist pattern 111, the link base later 112 of an intrinsic base of the NPN bipolar transistor is formed by implanting an impurity (first conductivity type impurity of a second concentration) 121 of $BF_2$ or the like into the semiconductor substrate 100 in this region. Then, as shown in FIG. 3C, after a region where to form the PMOS transistor (first conductivity type MOS transistor forming region) and a region where to form the emitter and the collector of a PNP bipolar transistor (second conductivity type bipolar transistor forming region) are defined by a resist pattern 113, an impurity of $BF_2$ or the like (first conductivity type impurity of a third concentration) 121 is introduced into these regions, whereby 114c are formed in the region where to form the PMOS transistor and an emitter layer 114a and a collector layer 114b are formed in the region where to form the PNP bipolar transistor (second forming step). It is possible to form the link base layer 112 of the intrinsic base of the NPN bipolar transistor, the LDD layers 114c of the PMOS transistor, and the emitter layer 114a and the collector layer 114b of the horizontal PNP bipolar transistor by the same impurity implantation with the same mask.

Figure 4A:
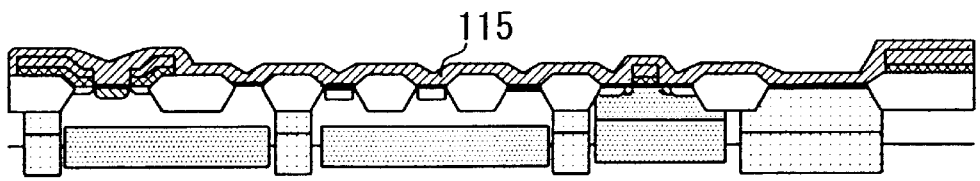
FIGS. 4A–4D show a process of a manufacturing method according to embodiments 1 or 2 of a BiCMOS semiconductor device having self-aligned high-performance bipolar transistors and a CMOS transistor on the same substrate.
Figure 4B:
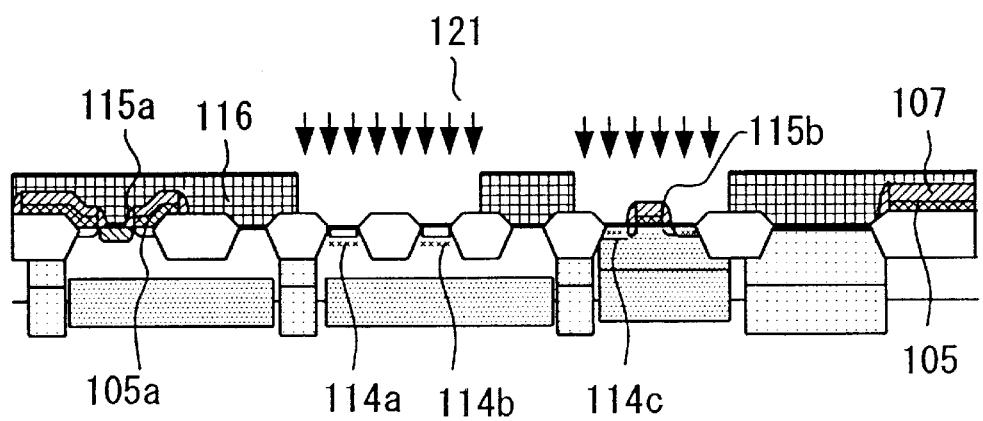

As shown in FIG. 4A, an insulating film (fifth insulating film) 115 of TEOS or the like is deposited over the entire area. As shown in FIG. 4B, the insulating film 115 is, for example, dry-etched, whereby frames 105a and 105b are formed on the side face of the external base lead-out electrode 105a of the NPN bipolar transistor and the side face of the gate of the PMOS transistor, respectively (frame forming step). Then, after a region where to form an intrinsic base of the PNP bipolar transistor (second conductivity type bipolar transistor intrinsic base forming region) and a region where to form the PMOS transistor (first conductivity type MOS transistor forming region) are defined by a resist pattern 116, an impurity (first conductivity type impurity of a fourth concentration) 121 of $BF_2$ of the like is implanted, whereby the emitter layer 114a and the collector layer 114b of the horizontal PNP bipolar transistor are finally formed and the source and drain of the PMOS transistor are formed (third forming step). As shown in FIG. 4D, an insulating film (sixth insulating film) 119 to become a gate oxide film of an NMOS transistor is formed (sixth insulating film forming step).

Figure 5A:
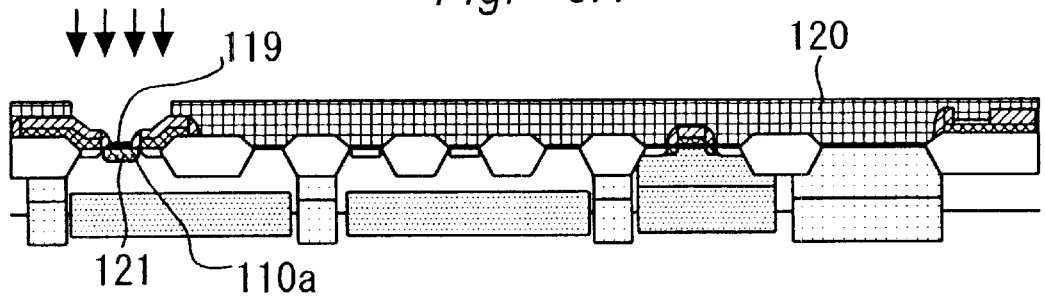
FIGS. 5A–5C show a process of a manufacturing method according to embodiment 1 of a BiCMOS semiconductor device having self-aligned high-performance bipolar transistors and a CMOS transistor on the same substrate.
Figure 5B:
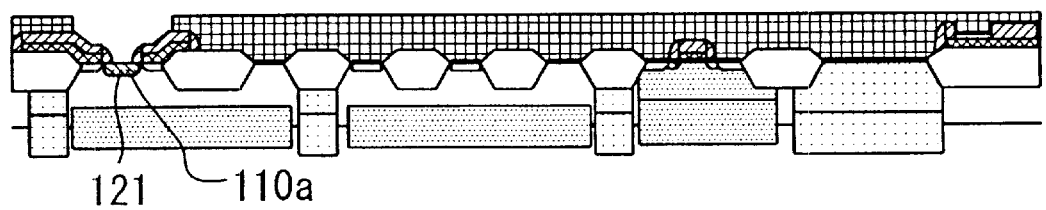
Figure 5C:
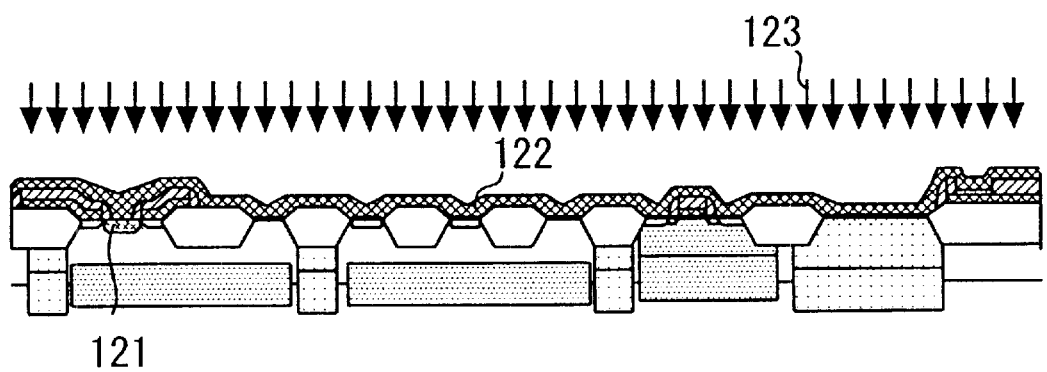

As shown in FIG. 5A, after a region where to form an external base lead-out electrode 105a of the NPN bipolar transistor is defined by a resist pattern 120, the intrinsic base layer 110a of the NPN bipolar transistor is formed by implanting an impurity (first conductivity type impurity of a fifth concentration) 121 of $BF_2$ or the like. Subsequently, as shown in FIG. 5B, a portion of the insulating film 119 above the intrinsic base region is removed by etching and thereby the major surface of the semiconductor substrate 100 is exposed there (semiconductor substrate exposing step). As shown in FIG. 5C, a polysilicon film (second polysilicon film) 122 to become an emitter lead-out electrode of the NPN bipolar transistor and the gate of the NMOS transistor is deposited and an impurity (second conductivity type impurity of a first concentration) 123 of As or the like is implanted into the polysilicon film 122 over the entire area.

Figure 6A:
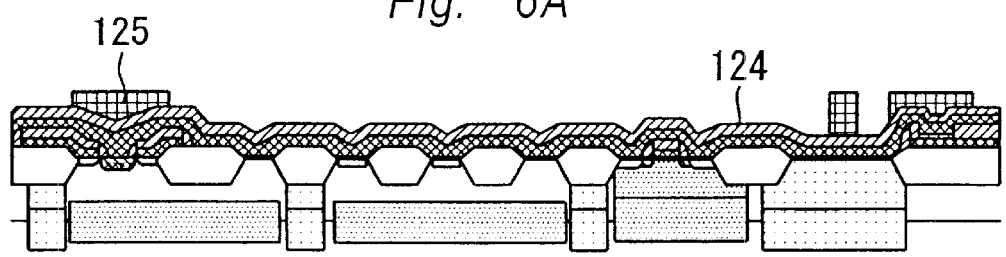
FIGS. 6A–6D show a process of a manufacturing method according to embodiment 1 of a BiCMOS semiconductor device having self-aligned high-performance bipolar transistors and a CMOS transistor on the same substrate.
Figure 6B:
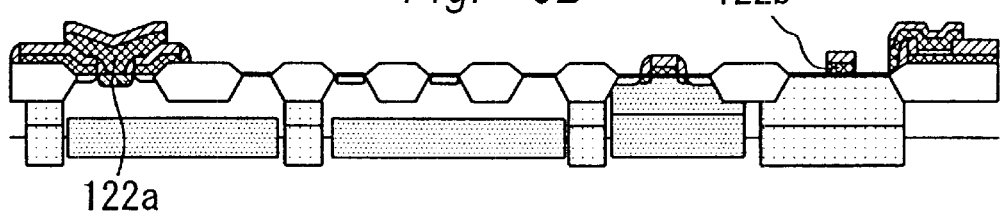
Figure 6C:
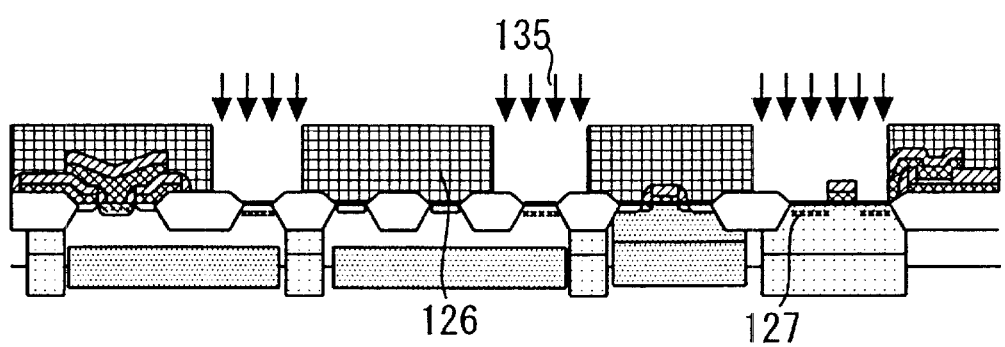
Figure 6D:
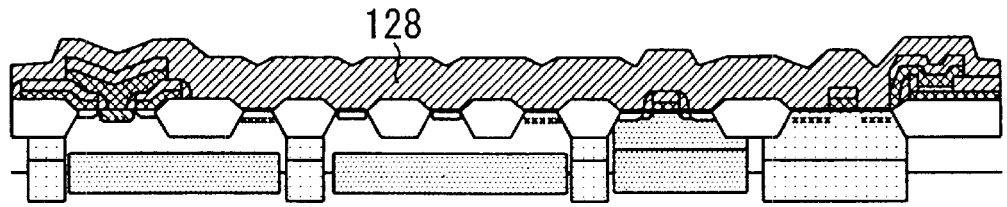

As shown in FIG. 6A, an insulating film (seventh insulating film) 124 of TEOS or the like is deposited over the entire area. Then, after prescribed regions of the stacked film of the insulating film 124 and the polysilicon film 122 is defined by a resist pattern 125, as shown in FIG. 6B an emitter lead-out electrode 122a of the NPN bipolar transistor and the gate 122b of the NMOS transistor (second conductivity type MOS transistor) are formed at the same time by dry etching or the like (fourth forming). As shown in FIG. 6C, after a region where to form the NMOS transistor is defined by a resist pattern 126, LDD layers 127 of the NMOS transistor are formed by implanting an impurity (second conductivity type impurity of a second concentration) 135 of P or the like (second conductivity type MOS transistor LDD layer forming step). As shown in FIG. 6D, an insulating film (eighth insulating film) 128 of TEOS or the like is deposited.

Figure 7A:
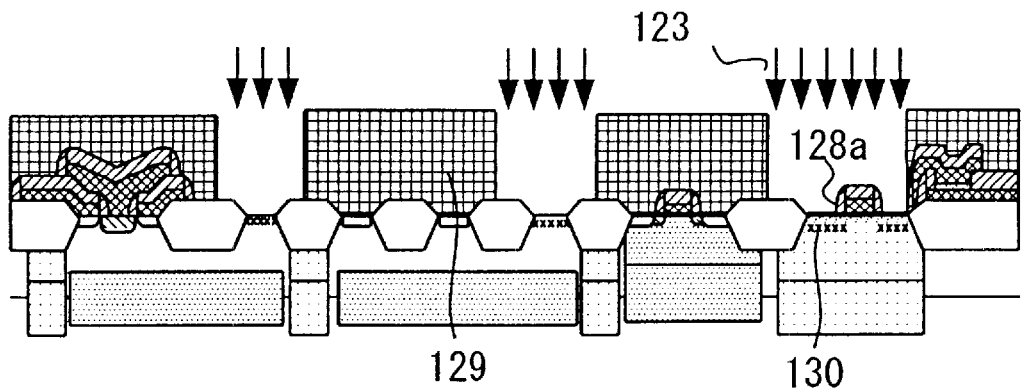
FIGS. 7A–7C show a process of a manufacturing method according to embodiment 1 of a BiCMOS semiconductor device having self-aligned high-performance bipolar transistors and a CMOS transistor on the same substrate.
Figure 7B:
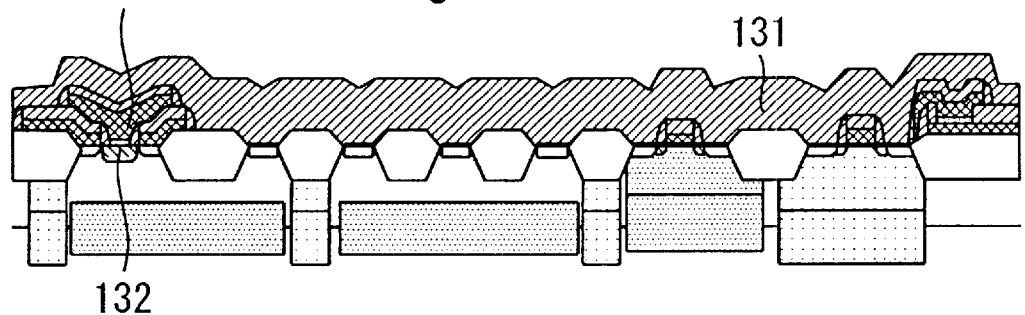
Figure 7C:
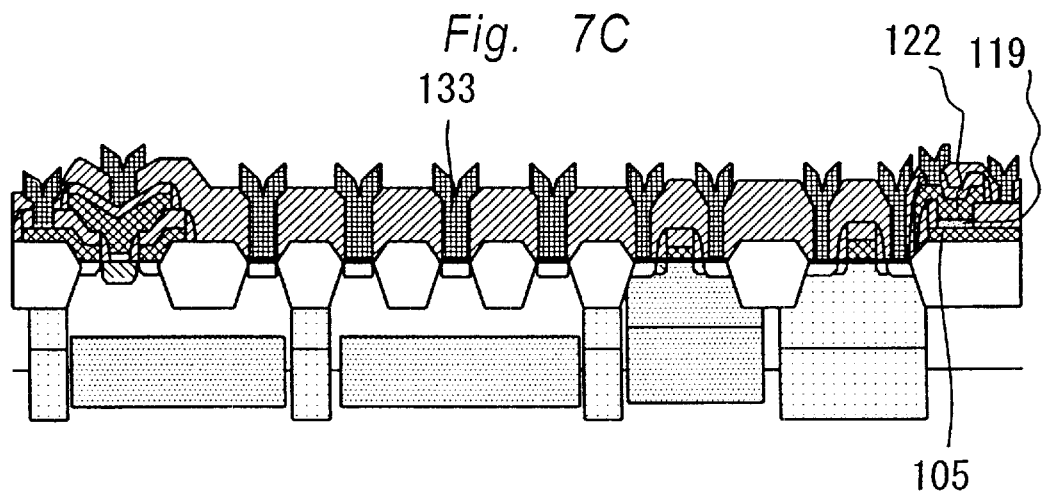

As shown in FIG. 7A, a frame 128a is formed on the side face of the gate of the NMOS transistor by dry etching. Then, after a region where to form the NMOS transistor is defined by a resist pattern 129, source and drain layers 130 of the NMOS transistor are formed by implanting an impurity (second conductivity type of a third concentration) 123 of As or the like (second conductivity type MOS transistor source and drain layers forming step). As shown in FIG. 7B, an interlayer insulating film 131 such as a TEOS/BPSG/TEOS film is deposited and its surface is planarized by subjecting it to reflow. Further, an emitter layer 132 is formed by diffusing the impurity 121 into the semiconductor substrate 100 from the emitter lead-out electrode 122a. Finally, interconnections 133 etc. are formed as shown in FIG. 7C.

As described above, according to the embodiment 1, the base lead-out electrode 105a of the NPN bipolar transistor and the gate 105b of the PMOS transistor can be formed at the same time by using the same material (polysilicon film 105), and the emitter lead-out electrode 122a of the NPN bipolar transistor and the gate 122b of the NMOS transistor can be formed at the same time by using the same material (polysilicon film 122). Therefore, a surface channel PMOS transistor can be obtained while an increase in the number of manufacturing steps is prevented. As a result, the leak current of the PMOS transistor can be reduced and the threshold voltage Vth can be controlled easily.

Embodiment 2

Figure 4C:
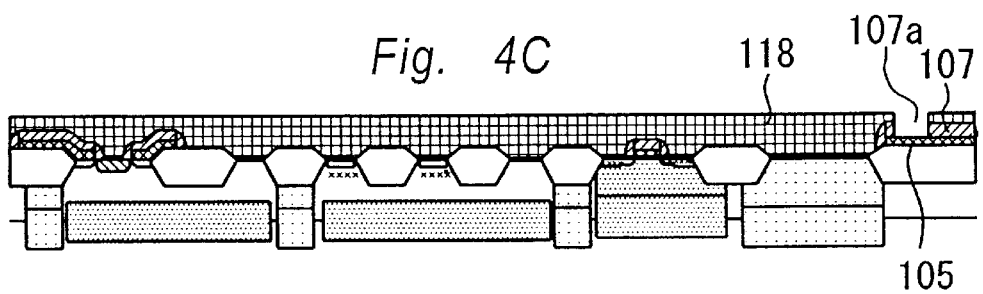
Figure 4D:
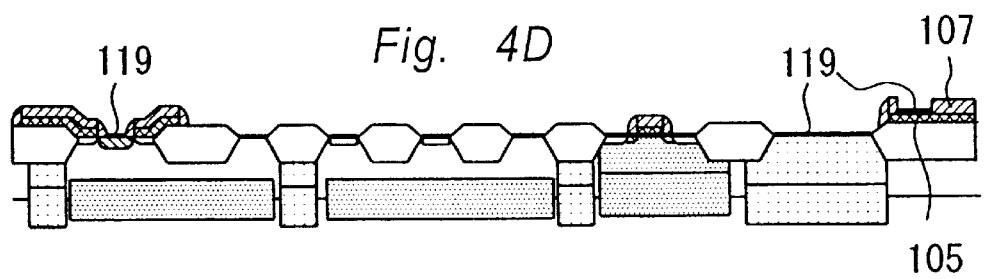

FIGS. 4C and 4D show part of a process of a manufacturing method according to a embodiment 2 of the invention of a BiCMOS semiconductor device having self-aligned high-performance bipolar transistors and a CMOS transistor on the same substrate. The steps of the embodiment 2 shown by FIGS. 1A–4A and 5A–7C are the same as those of the embodiment 1 and hence will not be described.

As shown in FIG. 4B, after the resist pattern 116 is formed, the impurity 121 of $BF_2$ or the like is implanted, whereby the emitter layer 114a and the collector layer 114b of the horizontal PNP bipolar transistor and the source and drain of the PMOS transistor are formed. Subsequently, as shown in FIG. 4C, an opening 107 is formed in the insulating film 107 in a region defined by a resist pattern 118 and a portion of the polysilicon film 105 is exposed in the opening 107a. As a result, as shown in FIG. 7C, a capacitor is formed in which the polysilicon film 105, the polysilicon film 122, and the insulating film 119 serve as a bottom electrode, a top electrode, and a dielectric material, respectively.

As described above, according to the embodiment 2, a high-performance capacitor having only a small parasitic capacitance can be formed only by adding one mask without increasing an electrode forming step.

Embodiment 3

FIGS. 1B and 3A show part of a process of a manufacturing method according to a embodiment 3 of the invention of a BiCMOS semiconductor device having self-aligned high-performance bipolar transistors and a CMOS transistor on the same substrate. The steps of the embodiment 3 shown by the figures other than FIGS. 1B and 3A are the same as those of the embodiment 1 and hence will not be described.

The thickness of the insulating film 103 (second insulating film) shown in FIG. 1B is set different from that of the insulating film 119 (sixth insulating film) shown FIG. 3A. As a result, a BiCMOS semiconductor device can be manufactured in which the PMOS transistor and the NMOS transistor have different gate breakdown voltages.

As described above, according to the embodiment 3, since the thickness of the insulating film 103 is set different from that of the insulating film 119, a BiCMOS semiconductor device can be manufactured in which the PMOS transistor and the NMOS transistor have different gate breakdown voltages.

Embodiment 4

Figure 8:
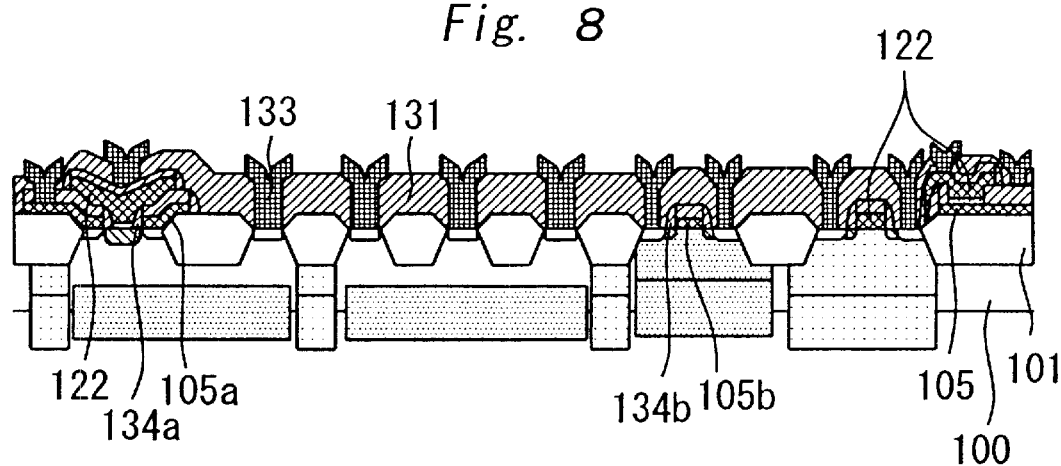
FIG. 8 shows a process of a manufacturing method according to embodiment 4 of a BiCMOS semiconductor device having self-aligned high-performance bipolar transistors and a CMOS transistor on the same substrate.

FIGS. 4A and 8 show part of a process of a manufacturing method according to a embodiment 4 of the invention of a BiCMOS semiconductor device having self-aligned high-performance bipolar transistors and a CMOS transistor on the same substrate. The steps of the embodiment 4 shown by the figures other than FIGS. 4A and 8 are the same as those of the embodiment 1 and hence will not be described.

Polysilicon films 134a and 134b (third polysilicon film) shown in FIG. 8 are used instead of the insulating film 115 shown in FIG. 4A. In this case, LDD frames can be formed on a side face 134a of the external base lead-out electrode 105a of the NPN bipolar transistor and a side face 134b of the gate 105b of the PMOS transistor. Satisfactory results are obtained by making the polysilicon films 134a and 134b different in material from the insulating film 115.

As described above, according to the embodiment 4, by using the polysilicon films 134a and 134b to form the side face 134a of the base lead-out electrode 105a of the NPN bipolar transistor and the side face 134b of the gate 105b of the PMOS transistor, an NPN bipolar transistor having smaller dispersion can be manufactured.

Embodiment 5

Figure 9:
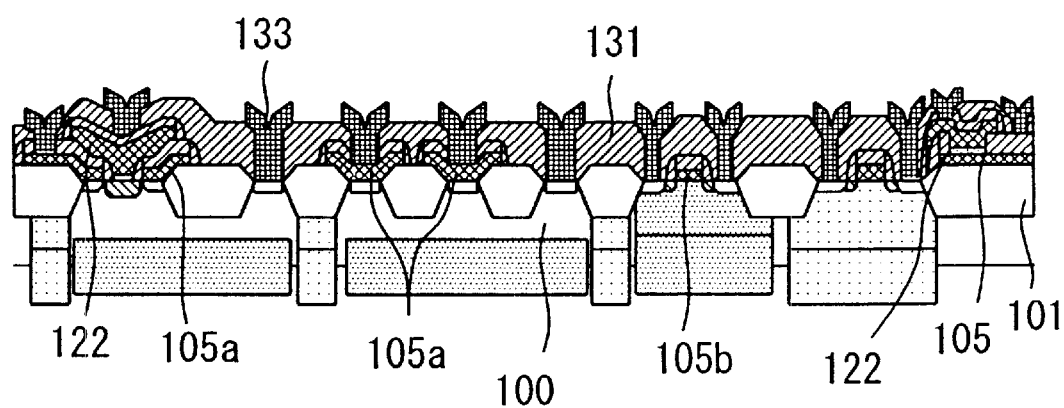
FIG. 9 shows a process of a manufacturing method according to embodiment 5 of a BiCMOS semiconductor device having self-aligned high-performance bipolar transistors and a CMOS transistor on the same substrate.

FIG. 9 shows part of a process of a manufacturing method according to a embodiment 5 of the invention of a BiCMOS semiconductor device having self-aligned high-performance bipolar transistors and a CMOS transistor on the same substrate. The steps of the embodiment 5 shown by the figures other than FIG. 9 are the same as those of the embodiment 1 and hence the explanation will be omitted.

As shown in FIG. 9, the emitter and collector of the horizontal PNP bipolar transistor are formed by diffusing the p-type impurity into the semiconductor substrate 100 from the external base lead-out electrode 105a of the PNP bipolar transistor. In this case, limitations on the interval between interconnections are eliminated and hence the device area can be reduced.

As described above, according to the embodiment 5, since the emitter and collector of the horizontal PNP bipolar transistor are formed by diffusing the p-type impurity into the semiconductor substrate 100 from the base lead-out electrode 105a of the PNP bipolar transistor, limitations on the interval between interconnections are eliminated and hence the device area can be reduced.

Embodiment 6

Figure 10:
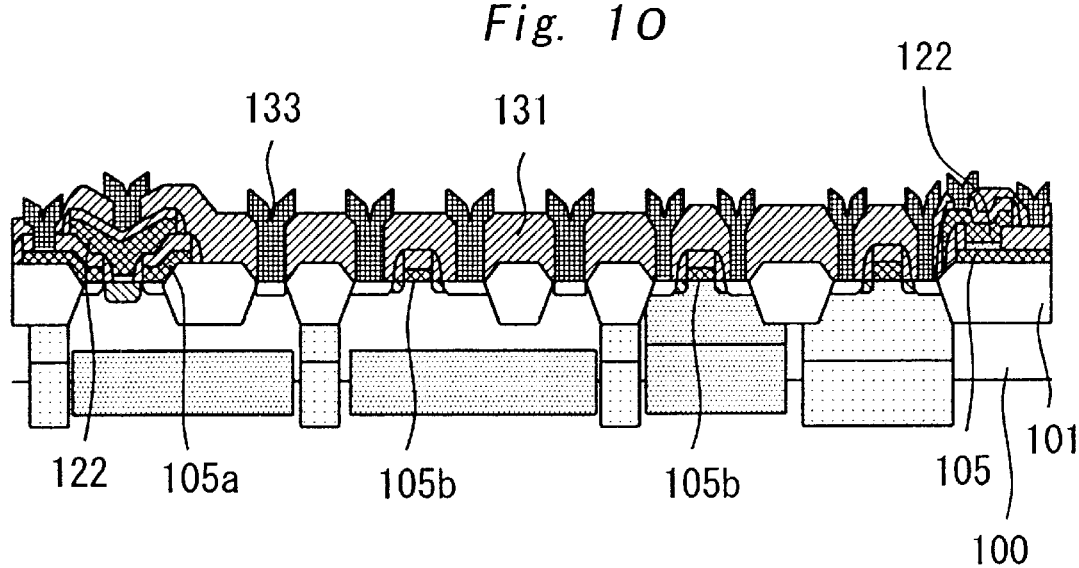
FIG. 10 shows a process of a manufacturing method according to embodiment 6 of a BiCMOS semiconductor device having self-aligned high-performance bipolar transistors and a CMOS transistor on the same substrate.

FIG. 10 shows part of a process of a manufacturing method according to a embodiment 6 of the invention of a BiCMOS semiconductor device having self-aligned high-performance bipolar transistors and a CMOS transistor on the same substrate. The steps of the embodiment 6 shown by the figures other than FIG. 10 are the same as those of the embodiment 1 and hence will not be described.

As shown in FIG. 10, the base of the horizontal PNP bipolar transistor is formed in the step of the embodiment 1 shown by FIG. 2H (the gate of the PMOS transistor is formed) or 3K.

As described above, according to the embodiment 6, by defining the base width of the horizontal PNP bipolar transistor by the PMOS transistor, the device area can be made smaller than in a conventional horizontal PNP bipolar transistor in which the base width is defined by a field oxide film.

Embodiment 7

FIGS. 11A–11D to 14A–14C show a process of a manufacturing method according to a embodiment 7 of the invention of a BiCMOS semiconductor device having self-aligned high-performance bipolar transistors and a CMOS transistor on the same substrate.

Figure 11A:
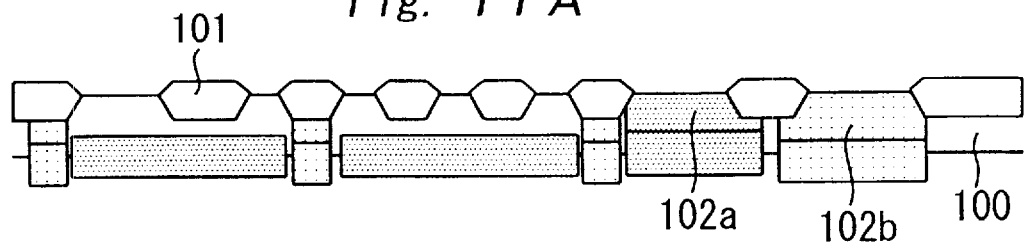
FIGS. 11A–11D show a process of a manufacturing method according to embodiment 7 of a BiCMOS semiconductor device having self-aligned high-performance bipolar transistors and a CMOS transistor on the same substrate.
Figure 11B:
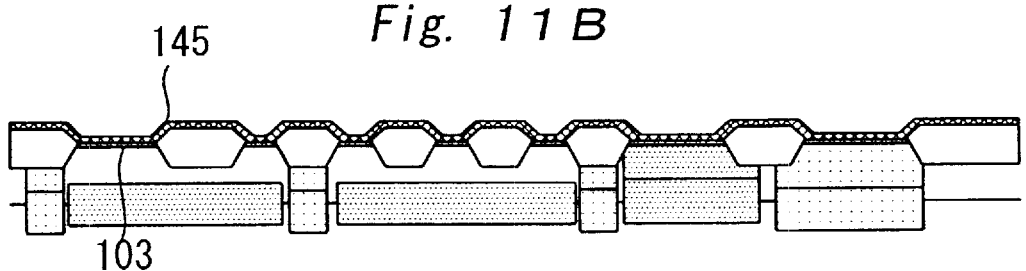
Figure 11C:
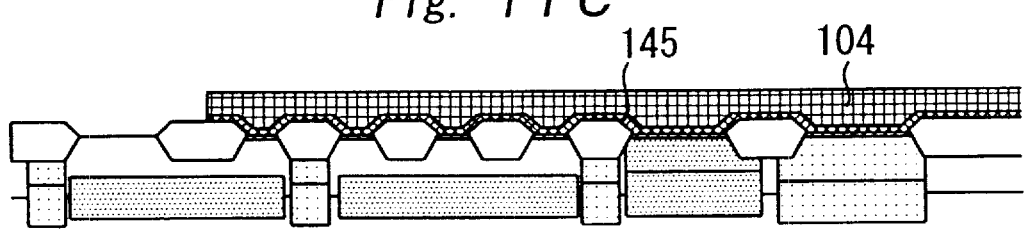
Figure 11D:
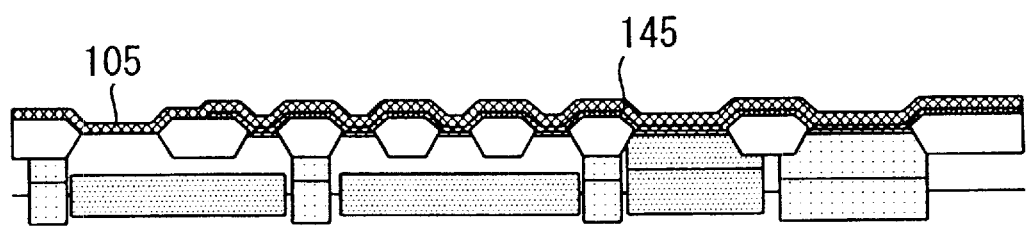

As shown in FIG. 11A, field oxide films 101 are formed by a LOCOS method or the like on a semiconductor substrate 100 having buried layers and well layers 102a and 102b are formed. Then, as shown in FIG. 11B, an insulating film 103 to become a gate oxide film of a PMOS transistor is formed on the semiconductor substrate 100 and the field oxide films 101. Subsequently, a polysilicon film 145 (fourth polysilicon film) is deposited.

The steps shown by FIGS. 11C to 12C that are executed after the deposition of the polysilicon film 145 are the same as the steps of the embodiment 1 shown by FIGS. 1C to 4D and hence will not be described.

Figure 12A:
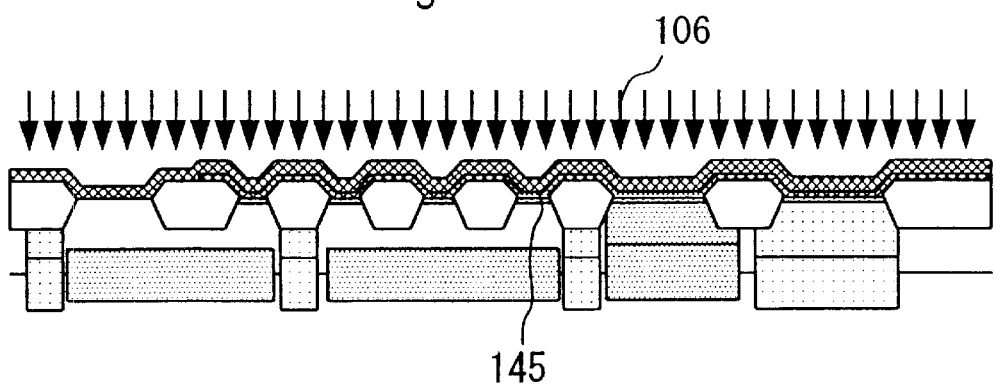
FIGS. 12A–12D show a process of a manufacturing method according to embodiment 7 of a BiCMOS semiconductor device having self-aligned high-performance bipolar transistors and a CMOS transistor on the same substrate.
Figure 12B:
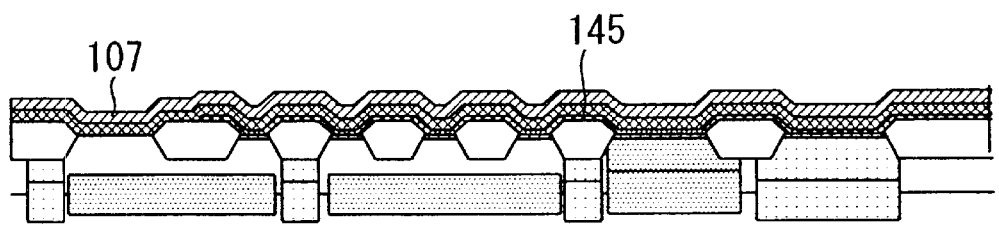
Figure 12C:
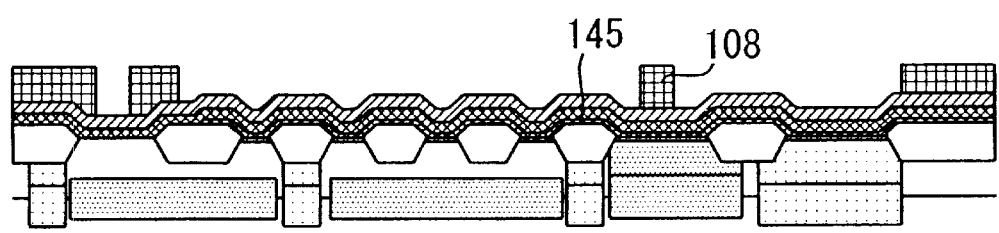
Figure 12D:
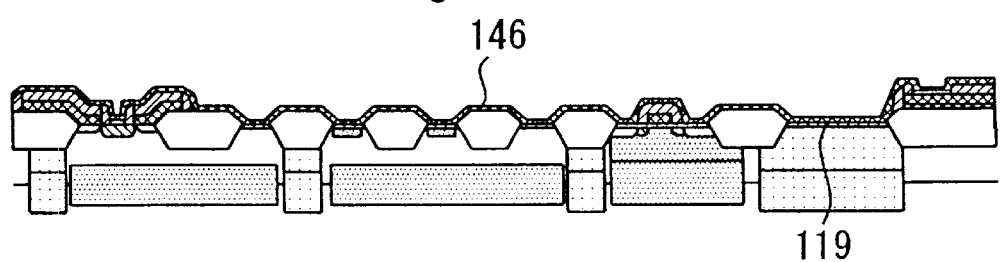
Figure 13A:
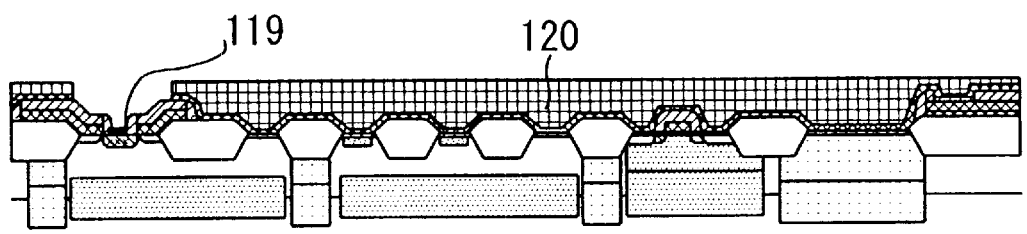
FIGS. 13A–13C show a process of a manufacturing method according to embodiment 7 of a BiCMOS semiconductor device having self-aligned high-performance bipolar transistors and a CMOS transistor on the same substrate.
Figure 13B:
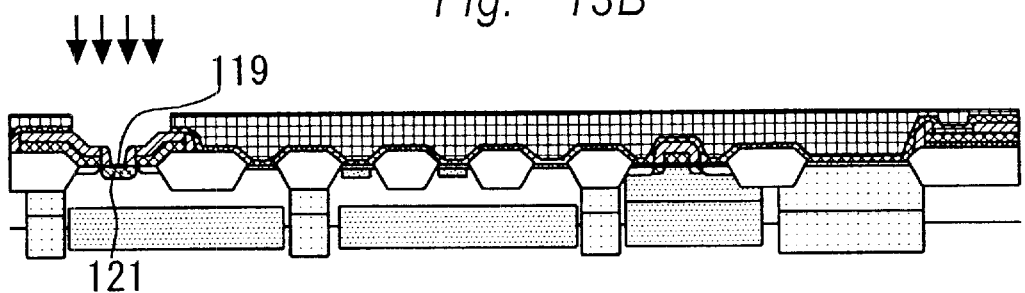
Figure 13C:
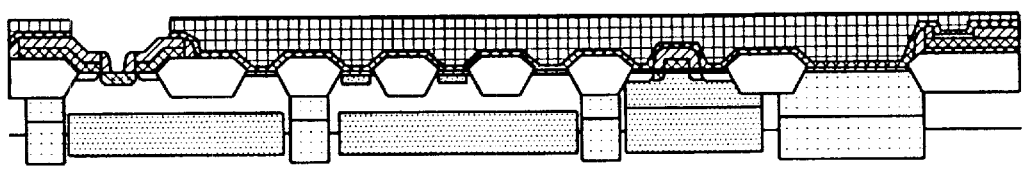

As shown in FIG. 12D, an insulating film 119 to become a gate oxide film of the NMOS transistor is formed. Subsequently, a polysilicon film 146 (fifth polysilicon film) is deposited.

The steps shown by FIGS. 13A to 14B that are executed after the deposition of the polysilicon film 146 are the same as the steps of the embodiment 1 shown by FIGS. 5A to 7B and hence will not be described.

Figure 14A:
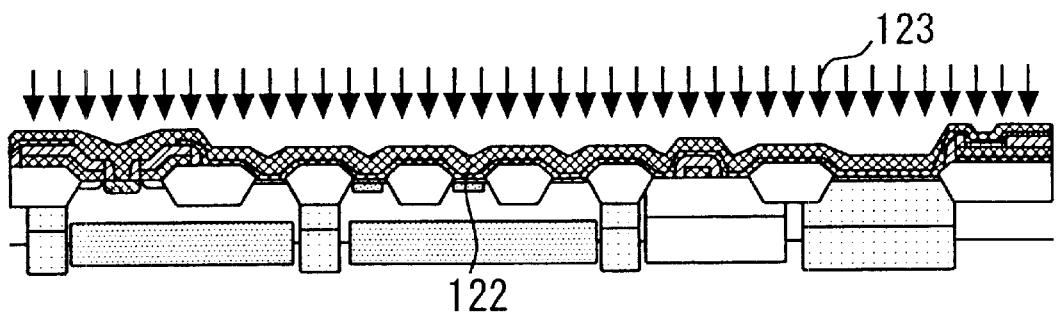
FIGS. 14A–14C show a process of a manufacturing method according to embodiment 7 of a BiCMOS semiconductor device having self-aligned high-performance bipolar transistors and a CMOS transistor on the same substrate.
Figure 14B:
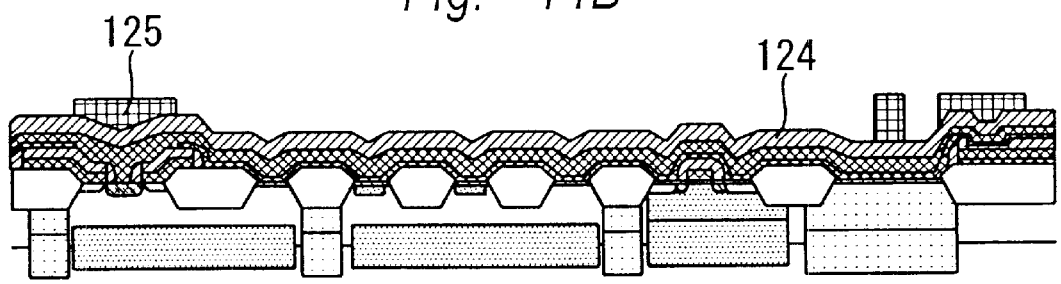
Figure 14C:
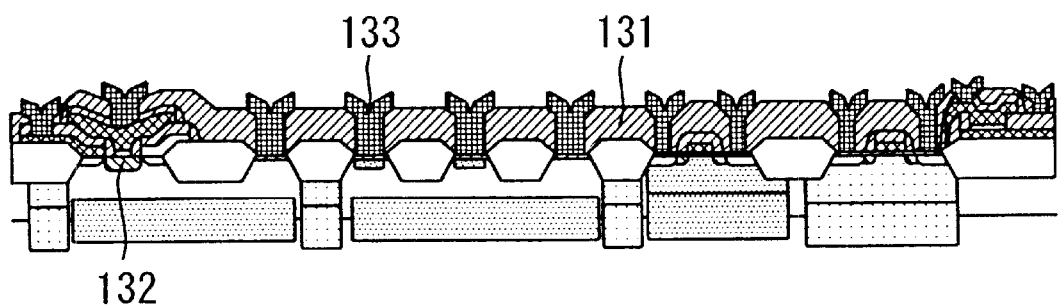
Figure 15A:
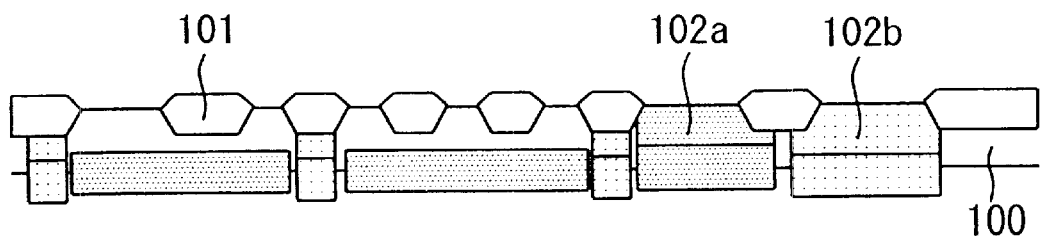
FIGS. 15A–15D show a process of a conventional manufacturing method of a BiCMOS semiconductor device having a self-aligned high-performance bipolar transistor and a CMOS transistor on the same substrate.
Figure 15B:
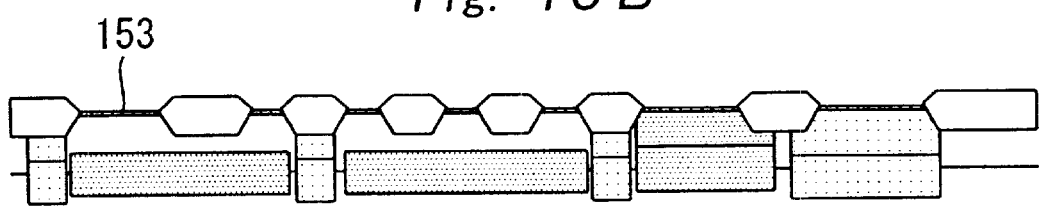
Figure 15C:
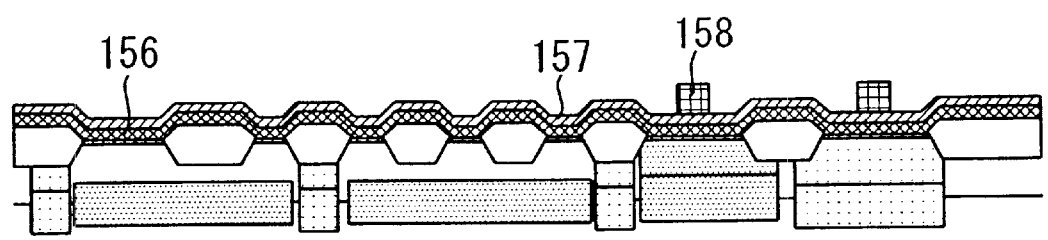
Figure 15D:
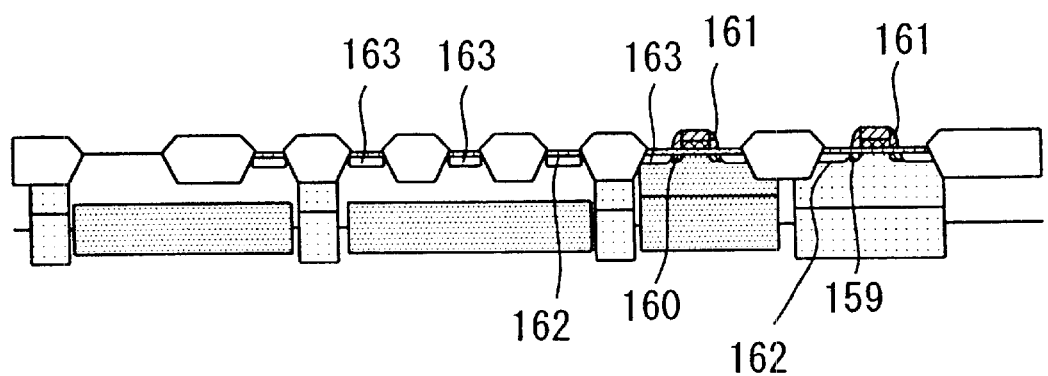
Figure 16A:
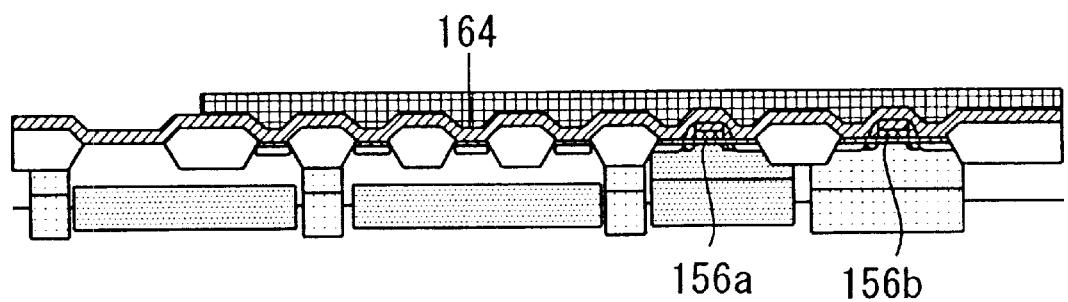
FIGS. 16A–16C show a process of a conventional manufacturing method of a BiCMOS semiconductor device having a self-aligned high-performance bipolar transistor and a CMOS transistor on the same substrate.
Figure 16B:
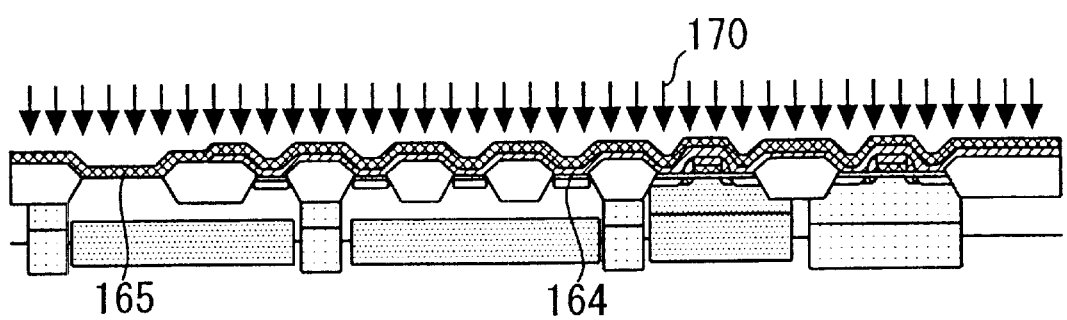
Figure 16C:
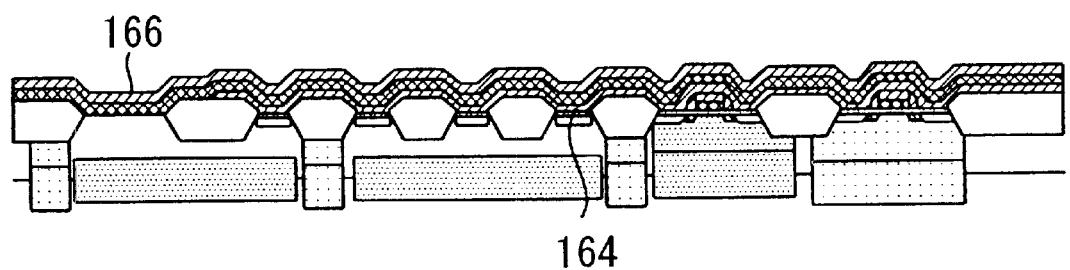
Figure 17A:
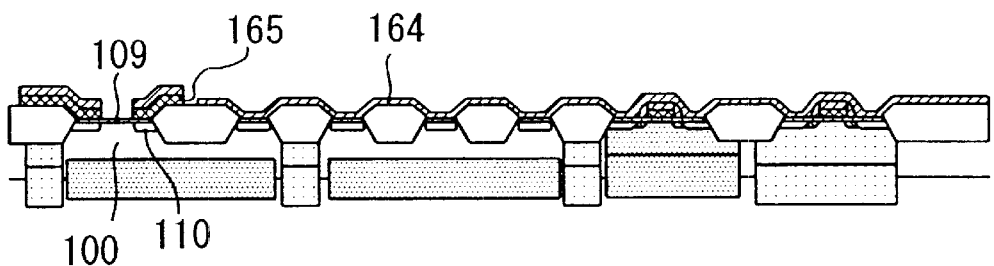
FIGS. 17A–17D show a process of a conventional manufacturing method of a BiCMOS semiconductor device having a self-aligned high-performance bipolar transistor and a CMOS transistor on the same substrate.
Figure 17B:
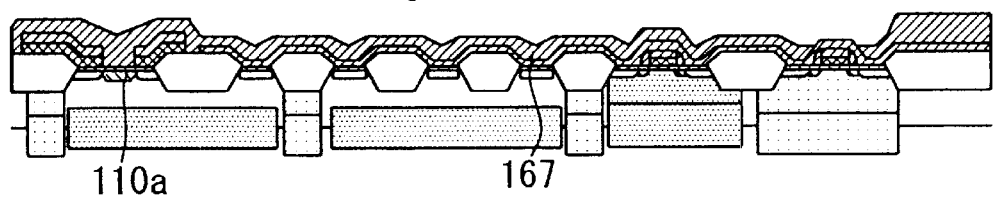
Figure 17C:
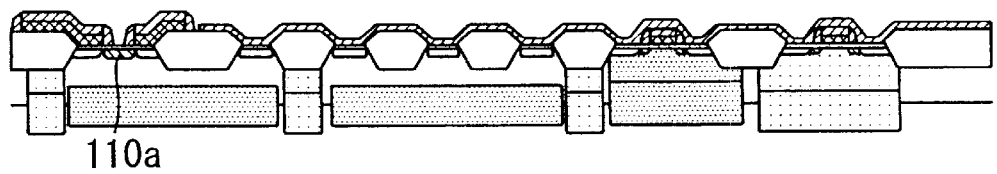
Figure 17D:
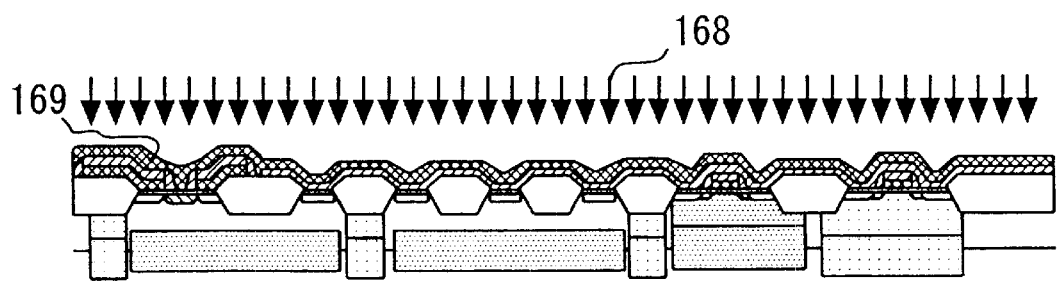
Figure 18A:
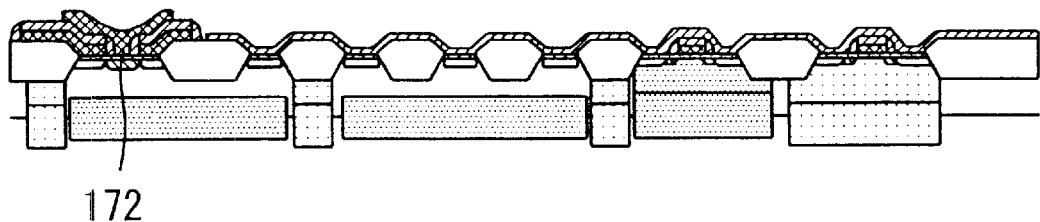
FIGS. 18A–18C show a process of a conventional manufacturing method of a BiCMOS semiconductor device having a self-aligned high-performance bipolar transistor and a CMOS transistor on the same substrate.
Figure 18B:
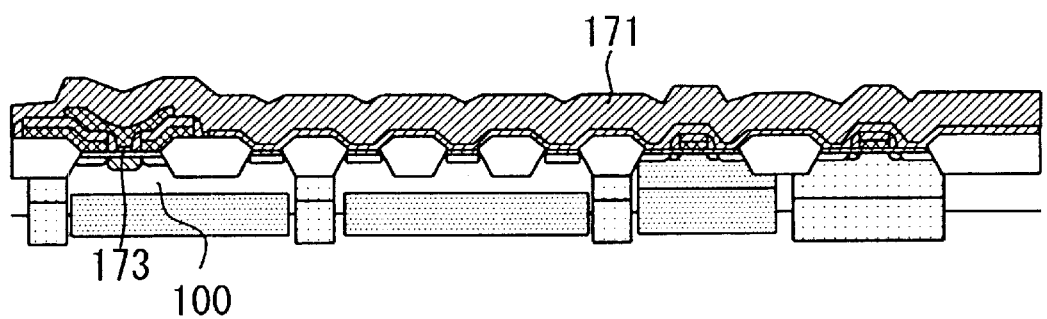
Figure 18C:
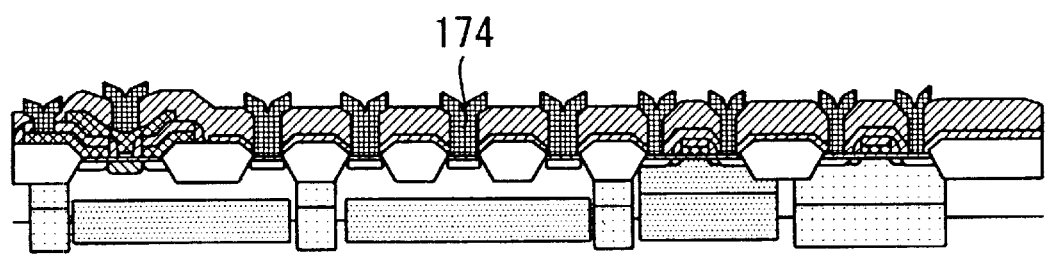

Finally, interconnections 133 etc. are formed as shown in FIG. 14C.

As described above, according to the embodiment 7, by depositing the polysilicon films on the gate oxide films of the PMOS transistor and the NMOS transistor, the gate oxide films can be protected from damage that would otherwise occur in forming the NPN bipolar transistor, whereby MOS transistors that are free of deterioration in transistor characteristics can be formed.

As described above, by forming the base lead-out electrode 105a of the NPN bipolar transistor and the gate 105b of the PMOS transistor at the same time by using the same material (polysilicon film 105), and forming the emitter lead-out electrode 122a of the NPN bipolar transistor and the gate 122b of the NMOS transistor can be formed at the same time by using the same material (polysilicon film 122), the invention can provide a manufacturing method of a semiconductor device which can form high-performance bipolar transistors and high-performance MOS transistors on the same substrate while minimizing increases in the number of manufacturing steps and the number of masks.

Here, the manufacturing method may further comprise, prior to the step of sixth insulating film forming, defining a predetermined region of the stacked film of the third insulating film and the first polysilicon film by photolithography, and exposing the first polysilicon film by etching the third insulating film there.

Here, the manufacturing method may further comprise the steps of, after the step of second forming: forming a third polysilicon film on the existing films; and forming frames on the side face of the external base lead-out electrode of the first conductivity type bipolar transistor and the side face of the gate of the first conductivity type MOS transistor by etching the third polysilicon film.

In the manufacturing method, the emitter and the collector of the second conductivity type bipolar transistor may be formed by introducing the first conductivity type impurity of a first concentration into the semiconductor substrate from the external base lead-out electrode of the second conductivity type bipolar transistor.

In the manufacturing method, a base of the second conductivity bipolar transistor may be formed in the same steps from the step of first forming to the step of second forming for forming the gate of the first conductivity type MOS transistor.

Here, the manufacturing method may further comprise, after the step of second insulating film forming, a step of forming a fourth polysilicon film on the second insulating film, and removing the second insulating film by etching the fourth polysilicon film on the region where to form the base of the first conductivity type bipolar transistor.

Here, the manufacturing method may further comprise, after the step of sixth insulating film forming, a step of forming a fifth polysilicon film on the sixth insulating film, and removing the sixth insulating film by etching the fifth polysilicon film on the region where to form the base of the first conductivity type bipolar transistor.

In the manufacturing method, the second insulating film and the sixth insulating film may be different from each other in film thickness.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 2000-11708 filed on Jan. 20, 2000 including specification, claims, drawings and summary are incorporated herein by reference in its entirety.

What is claimed is:

1. A manufacturing method of a semiconductor device which forms bipolar transistors and MOS transistors on the same semiconductor substrate, comprising the steps of:

a first insulating film forming of forming separated first insulating films on a major surface of the semiconductor substrate;

a second insulating film forming of forming a second insulating film on the semiconductor substrate and the first insulating films;

a second insulating film removing of removing a portion, on the semiconductor substrate, of the second insulating film in a region where to form a base of a first conductivity type bipolar transistor;

forming a first polysilicon film on a second-insulating-film-removed portion of the semiconductor substrate and a remaining portion of the second insulating film, implanting a first conductivity type impurity of a first concentration into the first polysilicon film, and forming a third insulating film on the first polysilicon film;

a first forming of forming, at the same time, an external base lead-out electrode and a gate of a first conductivity type MOS transistor on the semiconductor substrate by etching a stacked film of the first polysilicon film and the third insulating film in predetermined regions;

forming a fourth insulating film in the etched, predetermined regions of the stacked film, and, at the same time, forming an external base layer by introducing the first conductivity type impurity of a first concentration into the semiconductor substrate from the external base lead-out electrode of the first conductivity type bipolar transistor;

defining, by photolithography, a region where to form an external base lead-out electrode of the first conductivity type bipolar transistor, and forming the link base layer of the first conductivity type bipolar transistor by implanting the first conductivity type impurity of a second concentration into the semiconductor substrate in the defined region;

a second forming of defining, by photolithography, a first conductivity type MOS transistor forming region where to form the first conductivity type MOS transistor and a second conductivity type bipolar transistor forming region where to form an emitter and a collector of a second conductivity type bipolar transistor, and forming LDD layers in the first conductivity type MOS transistor forming region and an emitter layer and a collector layer in the second conductivity type bipolar transistor forming region by implanting the first conductivity type impurity of a third concentration into the semiconductor substrate in the first conductivity type MOS transistor forming region and the second conductivity type bipolar transistor forming region;

forming a fifth insulating film on the films existing after execution of said step of second forming;

a frame forming of forming frames on a side face of the external base lead-out electrode of the first conductivity type bipolar transistor and a side face of the gate of the first conductivity type MOS transistor by etching the fifth insulating film;

a third forming of defining, by photolithography, a second conductivity type bipolar transistor intrinsic base forming region where to form an intrinsic base of the second conductivity type bipolar transistor and a first conductivity type MOS transistor forming region where to form the first conductivity type MOS transistor, and implanting the first conductivity type impurity of a fourth concentration into the semiconductor substrate in the second conductivity type bipolar transistor intrinsic base forming region and the first conductivity type MOS transistor forming region, to form the emitter layer and the collector layer in the second conductivity type bipolar transistor intrinsic base forming region and to form a source and a drain in the first conductivity type MOS transistor forming region;

a sixth insulating film forming of forming a sixth insulating film on predetermined films existing after execution of said step of third forming;

defining, by photolithography, a region where to form an external base lead-out electrode of the first conductivity type bipolar transistor, and forming the intrinsic base layer of the first conductivity type bipolar transistor by implanting the first conductivity type impurity of a fifth concentration into the semiconductor substrate in the defined region;

a semiconductor substrate exposing of etching the sixth insulating film in the region where to form the external base lead-out electrode of the first conductivity type bipolar transistor, to expose the major surface of the semiconductor substrate there;

forming a second polysilicon film on the films existing after execution of said step of semiconductor substrate exposing, implanting a second conductivity type impurity of a first concentration into the second polysilicon film, and forming a seventh insulating film on the second polysilicon film;

a fourth forming of forming an emitter lead-out electrode of the first conductivity type bipolar transistor and a gate of a second conductivity type MOS transistor at the same time by etching a stacked film of the seventh insulating film and the second polysilicon film in predetermined regions;

a second conductivity type MOS transistor LDD layer forming of defining, by photolithography, a region where to form the second conductivity type MOS transistor, and forming LDD layers of the second conductivity type MOS transistor by implanting the second conductivity type impurity of a second concentration into the semiconductor substrate in the defined region;

forming an eighth insulating film on the films existing after execution of said step of second conductivity type MOS transistor LDD layer forming, and forming a frame on a side face of the gate of the second conductivity type MOS transistor by etching the eighth insulating film;

a second conductivity type MOS transistor source and drain layers forming of defining, by photolithography, a region where to form the second conductivity type MOS transistor, and forming a source layer and a drain layer of the second conductivity type MOS transistor by implanting the second conductivity type impurity of a third concentration in the semiconductor substrate in the defined region; and forming an interlayer insulating film on the films existing after execution of said step of second conductivity type MOS transistor source and drain layers forming, and forming an emitter layer by diffusing the first conductivity type impurity into the semiconductor substrate from the emitter lead-out electrode of the first conductivity type bipolar transistor.

2. The manufacturing method according to claim 1, further comprising, prior to said step of sixth insulating film forming, defining a predetermined region of the stacked film of the third insulating film and the first polysilicon film by photolithography, and exposing the first polysilicon film by etching the third insulating film there.

3. The manufacturing method according to claim 2, wherein the second insulating film and the sixth insulating film are different from each other in film thickness.

4. The manufacturing method according to claim 1, further comprising the steps of, after said step of second forming:

forming a third polysilicon film on the existing films; and forming frames on the side face of the external base lead-out electrode of the first conductivity type bipolar transistor and the side face of the gate of the first conductivity type MOS transistor by etching the third polysilicon film.

5. The manufacturing method according to claim 4, wherein the second insulating film and the sixth insulating film are different from each other in film thickness.

6. The manufacturing method according to claim 1, wherein the emitter and the collector of the second conductivity type bipolar transistor are formed by introducing the first conductivity type impurity of a first concentration into the semiconductor substrate from the external base lead-out electrode of the second conductivity type bipolar transistor.

7. The manufacturing method according to claim 6, wherein the second insulating film and the sixth insulating film are different from each other in film thickness.

8. The manufacturing method according to claim 1, wherein a base of the second conductivity bipolar transistor is formed in the same steps from said step of first forming to said step of second forming for forming the gate of the first conductivity type MOS transistor.

9. The manufacturing method according to claim 8, wherein the second insulating film and the sixth insulating film are different from each other in film thickness.

10. The manufacturing method according to claim 1, further comprising, after said step of second insulating film forming, a step of forming a fourth polysilicon film on the second insulating film, and removing the second insulating film by etching the fourth polysilicon film on the region where to form the base of the first conductivity type bipolar transistor.

11. The manufacturing method according to claim 10, wherein the second insulating film and the sixth insulating film are different from each other in film thickness.

12. The manufacturing method according to claim 1, further comprising, after said step of sixth insulating film forming, a step of forming a fifth polysilicon film on the sixth insulating film, and removing the sixth insulating film by etching the fifth polysilicon film on the region where to form the base of the first conductivity type bipolar transistor.

13. The manufacturing method according to claim 12, wherein the second insulating film and the sixth insulating film are different from each other in film thickness.

14. The manufacturing method according to claim 1, wherein the second insulating film and the sixth insulating film are different from each other in film thickness.

* * * * *